United States Patent
Lee

(10) Patent No.: US 8,866,381 B2
(45) Date of Patent: Oct. 21, 2014

(54) DISPLAY MODULE

(71) Applicant: Samsung Display Co., Ltd., Yongin (KR)

(72) Inventor: Kang-Yong Lee, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/840,364

(22) Filed: Mar. 15, 2013

(65) Prior Publication Data

US 2014/0077690 A1    Mar. 20, 2014

(30) Foreign Application Priority Data

Sep. 20, 2012 (KR) .................. 10-2012-0104418

(51) Int. Cl.
| | |
|---|---|
| *H01L 51/52* | (2006.01) |
| *H05B 33/04* | (2006.01) |
| *G02B 5/30* | (2006.01) |
| *H05K 5/00* | (2006.01) |
| *G02B 1/10* | (2006.01) |
| *H05K 5/02* | (2006.01) |

(52) U.S. Cl.
CPC .......... *H05K 5/0217* (2013.01); *H01L 51/5253* (2013.01); *H05B 33/04* (2013.01); *G02B 5/3025* (2013.01); *H05K 5/0017* (2013.01); *G02B 1/105* (2013.01)

USPC .............. 313/504; 345/173; 349/58; 313/512

(58) Field of Classification Search
None
See application file for complete search history.

(56) References Cited

U.S. PATENT DOCUMENTS

2012/0266450 A1*  10/2012  Jang et al. ................... 29/592.1
2013/0271896 A1*  10/2013  Hu et al. .................. 361/679.01

FOREIGN PATENT DOCUMENTS

| KR | 10-2010-0068632 | 6/2010 |
| KR | 10-2011-0080606 | 7/2011 |
| KR | 10-2011-0094618 | 8/2011 |

* cited by examiner

*Primary Examiner* — Donald Raleigh
(74) *Attorney, Agent, or Firm* — Knobbe Martens Olson & Bear LLP

(57) ABSTRACT

A display module includes a display panel, a window and an optical clear adhesive (OCA) film. The display panel has a first surface and a second surface opposite to the first surface. The window has a first surface facing the first surface of the display panel, and a second surface opposite to the first surface of the window. The OCA film attaches the display panel to the window. The OCA film includes a rear attaching portion attached to the second surface of the display panel. Thus, the rear attaching portion of the OCA film surrounds the second surface of the display panel so that a gap between the first glass substrate and the second glass substrate of the display panel is not be widened.

16 Claims, 4 Drawing Sheets

DISPLAY MODULE

CROSS-REFERENCE TO RELATED APPLICATIONS

This application claims priority to Korean Patent Application No. 10-2012-0104418, filed on Sep. 20, 2012 in the Korean Intellectual Property Office (KIPO), the content of which is herein incorporated by reference in its entirety.

BACKGROUND

1. Field

Example embodiments relate to a display module. More particularly, example embodiments relate to an organic light emitting display module.

2. Description of the Related Technology

An organic light emitting display (OLED) module displays desired information such as images, letters and/or characters using a light generated by combining holes provided from an anode with electrons provided from a cathode in an organic layer thereof. The OLED module may ensure a relatively large view angle, rapid response speed, small thickness, low power consumption, etc. Accordingly, the OLED module is expected to be one of the most prospecting next-generation display devices.

The OLED module includes a display panel, a window and an optical clear adhesive (OCA) film for attaching the window to the display panel. The OCA film may be arranged only on edge portions of the display panel and the window.

When external impacts are applied to the OLED module, the window may lean in a direction. Thus, an upper glass substrate of the display panel may also lean toward the leaning direction so that a gap between the upper glass substrate and a lower glass substrate may be widened. As a result, cracks may be generated in a sealing portion between the upper glass substrate and the lower glass substrate in the display panel.

SUMMARY OF CERTAIN INVENTIVE ASPECTS

Example embodiments provide a display module capable of suppressing cracks from being generated in a sealing by preventing a gap between an upper glass substrate and a lower glass substrate from being widened.

According to example embodiments, there is provided a display module. The display module includes a display panel, a window and an optical clear adhesive (OCA) film. The display panel has a first surface and a second surface opposite to the first surface. The window has a first surface facing the first surface of the display panel, and a second surface opposite to the first surface of the window. The OCA film attaches the display panel to the window. The OCA film includes a rear attaching portion attached to the second surface of the display panel.

The rear attaching portion may have a size substantially the same as that of the second surface of the display panel.

The OCA film may further include a front attaching portion attached to the first surface of the display panel.

The front attaching portion may have a size substantially the same as that of the first surface of the display panel.

The OCA film may further include a side attaching portion attached to side surfaces connected between the first surface and the second surface of the display panel.

The OCA film may further include an auxiliary attaching portion attached to the first surface of the window.

The display panel may include a first glass substrate attached to the rear attaching portion, a second glass substrate stacked on the first glass substrate, and a polarizing plate stacked to the second glass substrate and oriented toward the first surface of the window.

The OCA film may further include a front attaching portion interposed between the polarizing plate and the window.

The OCA film may further include a front attaching portion interposed between the second glass substrate and the polarizing plate.

The display module may further include a black film attached to the rear attaching portion.

According to example embodiments, there is provided a display module. The display module includes a display panel, a window and an optical clear adhesive (OCA) film. The display panel has a first surface and a second surface opposite to the first surface. The window has a first surface facing the first surface of the display panel, and a second surface opposite to the first surface of the window. The OCA film has a front attaching portion attached to the first surface of the display panel, a rear attaching portion attached to the second surface of the display panel, and a side attaching portion connected between the front attaching portion and the rear attaching portion and attached to side surfaces connected between the first surface and the second surface of the display panel.

The OCA film may further include an auxiliary attaching portion attached to the first surface of the window.

The display panel may include a first glass substrate attached to the rear attaching portion, a second glass substrate stacked on the first glass substrate, and a polarizing plate stacked to the second glass substrate and oriented toward the first surface of the window.

The front attaching portion may be interposed between the polarizing plate and the window.

The front attaching portion may be interposed between the second glass substrate and the polarizing plate.

The display module may further include a black film attached to the rear attaching portion.

According to example embodiments, the rear attaching portion of the OCA film surrounds the second surface of the display panel. Thus, a gap between the first glass substrate and the second glass substrate of the display panel is not widened. As a result, cracks are not generated in a sealing portion between the first glass substrate and the second glass substrate.

BRIEF DESCRIPTION OF THE DRAWINGS

Example embodiments will be more clearly understood from the following detailed description taken in conjunction with the accompanying drawings.

FIG. 1 is an exploded perspective view illustrating a display module in accordance with an example embodiment;

FIG. 2 is a plan view illustrating a portion of an OCA film attached to a first surface of a display panel in the display module in FIG. 1;

FIG. 3 is a bottom view illustrating a portion of the OCA film attached to a second surface of the display panel in the display module in FIG. 1;

FIG. 4 is a cross-sectional view illustrating the display module in FIG. 1;

FIG. 5 is a cross-sectional view illustrating a display module in accordance with an example embodiment; and FIG. 6 is a cross-sectional view illustrating a display module in accordance with an example embodiment.

DETAILED DESCRIPTION OF CERTAIN INVENTIVE EMBODIMENTS

Figure 1:
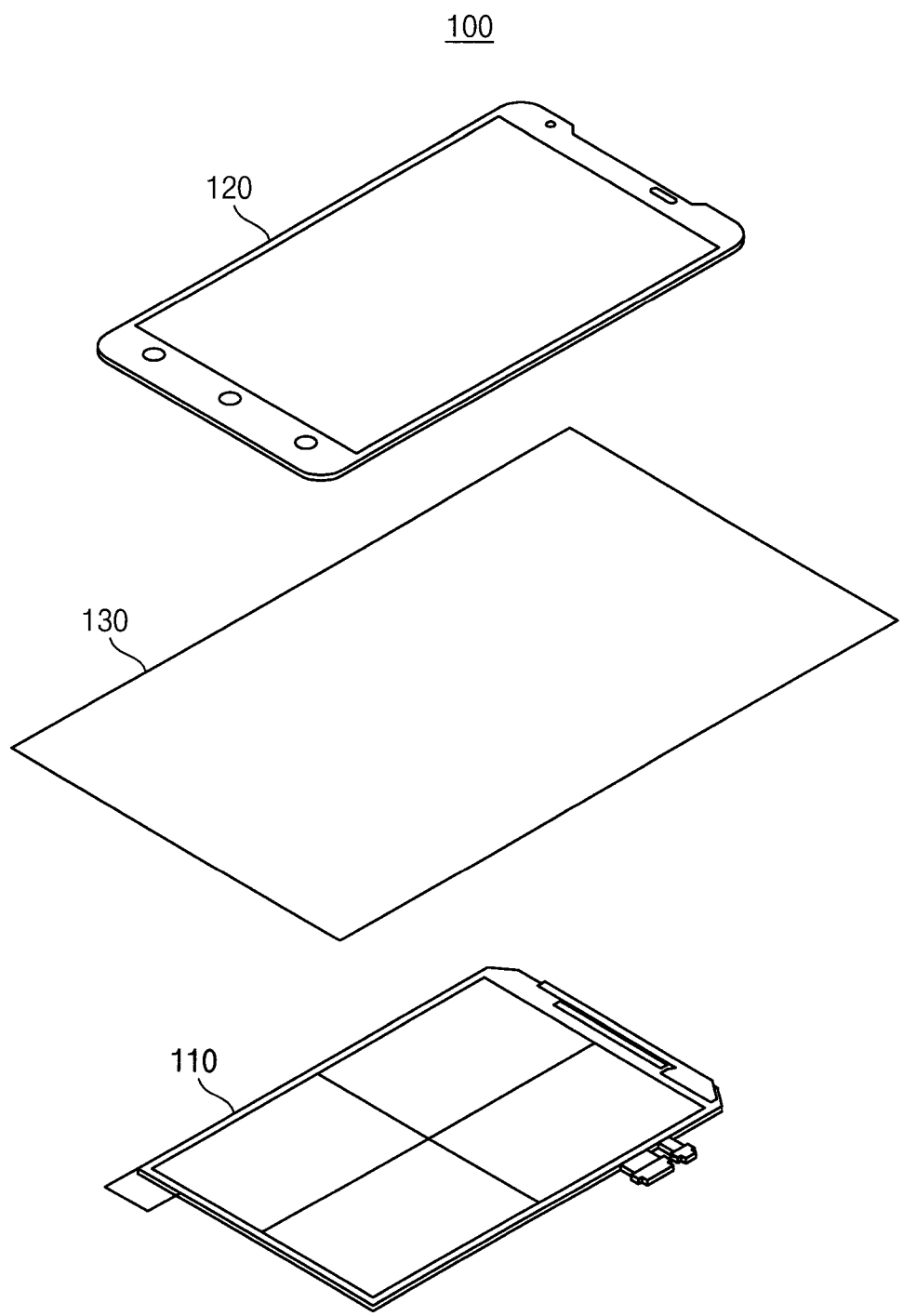
FIGS. 1 to 6 represent non-limiting, embodiments as described herein.

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals generally refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (for example, rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the face through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
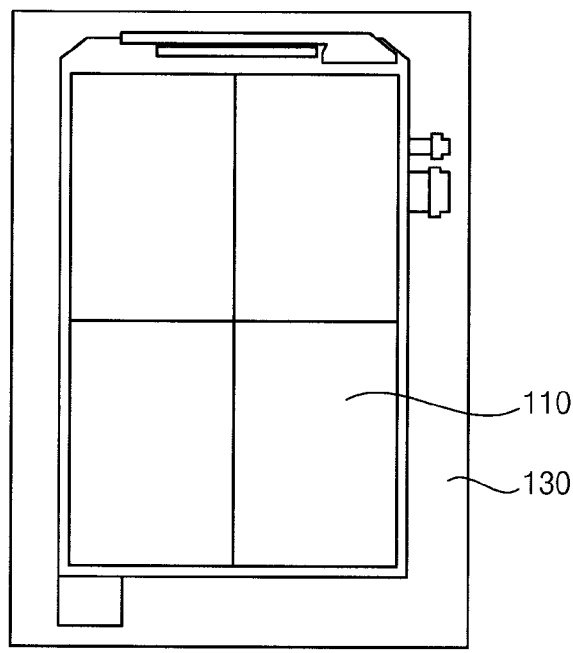
Figure 3:
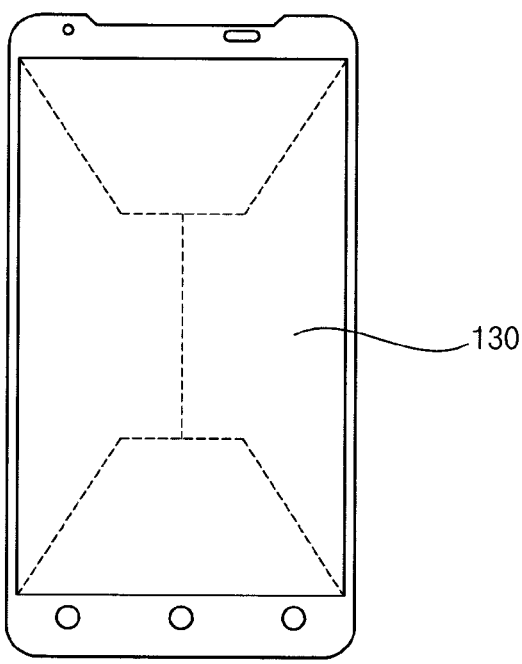
Figure 4:
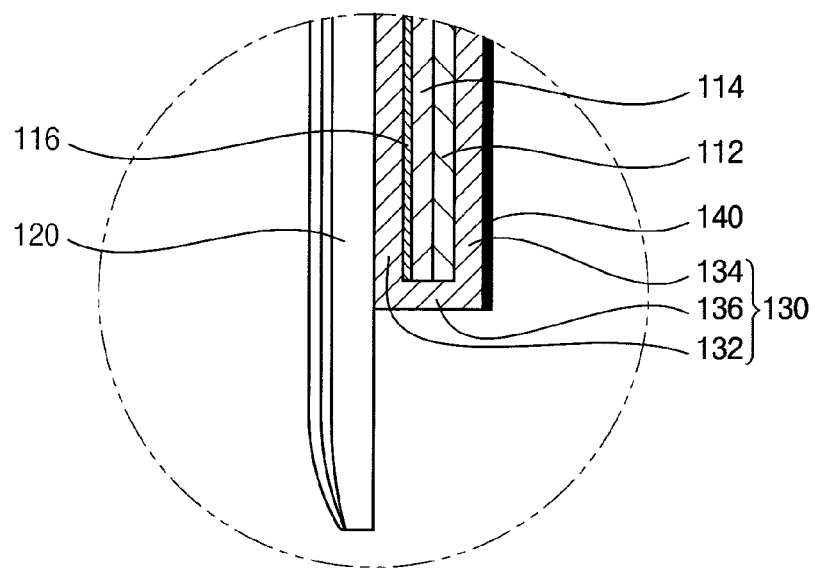

FIG. 1 is an exploded perspective view illustrating a display module in accordance with an example embodiment, FIG. 2 is a plan view illustrating a portion of an OCA film attached to a first surface of a display panel in the display module in FIG. 1, FIG. 3 is a bottom view illustrating a portion of the OCA film attached to a second surface of the display panel in the display module in FIG. 1, and FIG. 4 is a cross-sectional view illustrating the display module in FIG. 1.

Referring to FIG. 1, an embodiment of a display module 100 includes a display panel 110, a window 120 and an optical clear adhesive (OCA) film 130.

In example embodiments, the display panel 110 has a first surface and a second surface. The first surface of the display panel 110 is oriented toward the window 120. Thus, the first surface of the display panel 110 corresponds to a front surface of the display panel 110. The second surface of the display panel 110 is opposite to the first surface of the display panel 110. Thus, the second surface of the display panel 110 corresponds to a rear surface of the display panel 110. In example embodiments, the display panel 110 includes a liquid crystal display (LCD) panel, a plasma display panel, an organic light emitting display (OLED) panel, etc. Particularly, the display panel 110 includes an active matrix OLED (AMOLED) panel.

Referring to FIG. 4, the display panel 110 includes a first glass substrate 112, a second glass substrate 114 and a polarizing plate 116. The first glass substrate 112, the second glass substrate 114 and the polarizing plate 116 are sequentially stacked toward the window 120. Thus, the first glass substrate 112 corresponds to the second surface of the display panel 110. The polarizing plate 116 corresponds to the first surface of the display panel 110.

The window 120 is arranged over the display panel 110. Therefore, the window 120 has a first surface facing the first surface of the display panel 110, and a second surface opposite to the first surface of the window 120. The first surface of the window 120 faces the polarizing plate 116.

The OCA film 130 is interposed between the display panel 110 and the window 120. The OCA film 130 serves to attach the display panel 110 to the window 120.

Referring to FIG. 2, the OCA film 130 has a size larger than that of the first surface of the display panel 110. Further, referring to FIG. 3, the OCA film 130 has a size capable of surrounding the second surface of the display panel 110. Thus, the OCA film 130 attached to the first surface of the display panel 110 is bent. The bent portion of the OCA film 130 is attached to the second surface of the display panel 110. As a result, the OCA film 130 has a structure configured to surround the first surface, the second surface and side surfaces connected between the first surface and the second surface in the display panel 110.

Referring to FIG. 4, the OCA film 130 includes a front attaching portion 132, a rear attaching portion 134 and a side attaching portion 136. The front attaching portion 132 is attached to the first surface of the display panel 110. The rear attaching portion 134 is attached to the second surface of the display panel 110. The side attaching portion 136 is connected between the front attaching portion 132 and the rear attaching portion 134. The side attaching portion 136 is attached to the side surfaces of the display panel 110.

In example embodiments, the front attaching portion 132 is attached to the polarizing plate 116 oriented toward the window 120. The rear attaching portion 134 is attached to a lower surface of the first glass substrate 112. The side attaching portion 136 is attached to the side surfaces of the first glass substrate 112, the second glass substrate 114 and the polarizing plate 116.

In example embodiments, because the OCA film 130 surrounds the first surface, the second surface and the side surfaces of the display panel 110, the OCA film 130 mitigates external impacts applied to the display panel 110. Thus, a gap between the first glass substrate 112 and the second glass substrate 114 is not widened. As a result, cracks are not generated in a sealing portion between the first glass substrate 112 and the second glass substrate 114.

In example embodiments, the display module 100 can be manufactured by stacking the first glass substrate 112, the second glass substrate 114 and the polarizing plate 116, attaching the OCA film 130 to the first glass substrate 112, the second glass substrate 114 and the polarizing plate 116, and attaching the window 120 to the OCA film 130.

Additionally, the display module 100 may further include a black film 140. The black film 140 is attached to the rear attaching portion 134 of the OCA film 130. The black film 140 prevents a rear surface of the display panel from being shown. Alternatively, the rear attaching portion 134 may have a black color instead of the black film 140.

Figure 5:
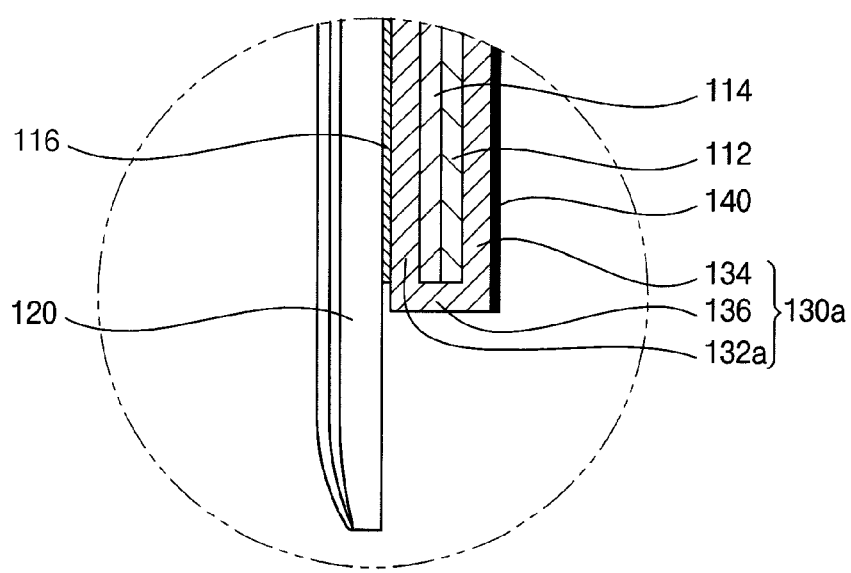

FIG. 5 is a cross-sectional view illustrating a display module in accordance with another example embodiment.

A display module 100a of this example embodiment includes elements substantially the same as those of the display module 100 in FIG. 4 except for a position of a front attaching portion 132a of an OCA film 130a. Thus, the same reference numerals refer to the same elements and any further illustrations with respect to the same element are omitted herein for brevity.

Referring to FIG. 5, the front attaching portion 132a of the OCA film 130a is interposed between the second glass substrate 114 and the polarizing plate 116. Thus, the front attaching portion 132a directly makes contact with the second glass substrate 114. The polarizing plate 116 is directly fixed to the window 120 using a resin.

In example embodiments, the display module 100a may be manufactured by attaching the OCA film 130a to the first glass substrate 112 and the second glass substrate 114, attaching the polarizing plate 116 to the OCA film 130a, and attaching the polarizing plate 116 to the window 120 using the resin.

Figure 6:
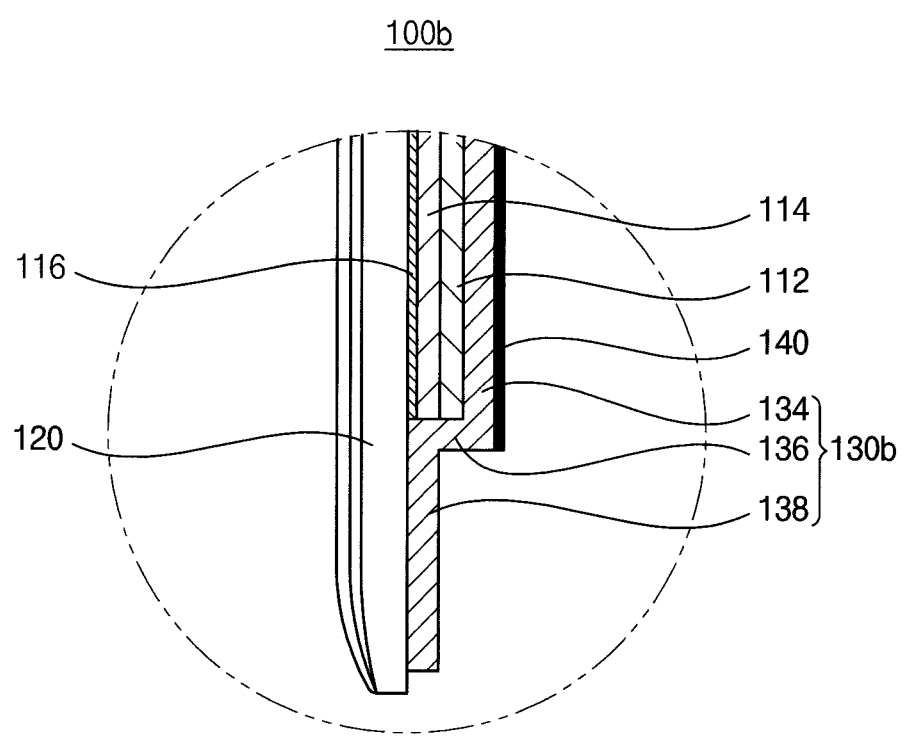

FIG. 6 is a cross-sectional view illustrating a display module in accordance with another example embodiment.

A display module 100b of this example embodiment includes elements substantially the same as those of the display module 100 in FIG. 4 except for an OCA film 130b. Thus, the same reference numerals refer to the same elements and any further illustrations with respect to the same element is omitted herein for brevity.

Referring to FIG. 6, the OCA film 130b of this example embodiment includes a rear attaching portion 134, a side attaching portion 136 and an auxiliary attaching portion 138. That is, the OCA film 130b of this example embodiment does not include a front attaching portion. Thus, the polarizing plate 116 may be directly attached to the window 120 using a resin.

The auxiliary attaching portion 138 is extended from the side attaching portion 136 toward an edge portion of the first surface of the window 120. Thus, the auxiliary attaching portion 138 has a rectangular parallelepiped shape configured to surround the edge portion of the window 120 exposed by the display panel 120. The auxiliary attaching portion 138 is attached to the edge portion of the first surface of the window 120.

In example embodiments, the display module 100b may be manufactured by stacking the first glass substrate 112, the second glass substrate 114 and the polarizing plate 116, attaching the polarizing plate 116 to the window 120 using the resin, and attaching the OCA film 130b to the second glass substrate 114 and the window 120.

According to example embodiments, the rear attaching portion of the OCA film surrounds the second surface of the display panel. Thus, a gap between the first glass substrate and the second glass substrate of the display panel is not widened. As a result, cracks are not generated in a sealing portion between the first glass substrate and the second glass substrate.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display module comprising:
    a display panel having a first display surface and a second display surface opposite to the first display surface;
    a window having a first window surface facing the first display surface and a second window surface opposite to the first window surface; and
    an optical clear adhesive (OCA) film attaching the display panel to the window, the OCA film including a rear attaching portion attached to the second display surface, wherein the rear attaching portion has a size substantially the same as that of the second display surface.

2. The display module of claim 1, wherein the OCA film further comprises a front attaching portion attached to the first display surface.

3. The display module of claim 2, wherein the front attaching portion has a size substantially the same as that of the first display surface.

4. The display module of claim 1, wherein the OCA film further comprises a side attaching portion attached to side surfaces of the display panel connected between the first and second display surfaces.

5. The display module of claim 1, wherein the OCA film further comprises an auxiliary attaching portion attached to the first window surface.

6. The display module of claim 1, wherein the display panel comprises:
- a first glass substrate attached to the rear attaching portion;
- a second glass substrate stacked on the first glass substrate; and
- a polarizing plate stacked on the second glass substrate and oriented toward the first window surface.

7. The display module of claim 6, wherein the OCA film further comprises a front attaching portion interposed between the polarizing plate and the window.

8. The display module of claim 6, wherein the OCA film further comprises a front attaching portion interposed between the second glass substrate and the polarizing plate.

9. The display module of claim 1, further comprising a black film attached to the rear attaching portion.

10. The display module of claim 1, wherein the display panel comprises an organic light emitting display (OLED) panel.

11. A display module comprising:
- a display panel having a first display surface and a second display surface opposite to the first display surface;
- a window having a first window surface facing the first display surface and a second window surface opposite to the first window surface; and
- an optical clear adhesive (OCA) film including a front attaching portion attached to the first display surface, a rear attaching portion attached to the second display surface, and a side attaching portion connected between the front attaching portion and the rear attaching portion and attached to side surfaces of the display panel connected between the first and second display surfaces, wherein the rear attaching portion has a size substantially the same as that of the second display surface.

12. The display module of claim 11, wherein the OCA film further comprises an auxiliary attaching portion attached to the first window surface.

13. The display module of claim 11, wherein the display panel comprises:
- a first glass substrate attached to the rear attaching portion;
- a second glass substrate stacked on the first glass substrate; and
- a polarizing plate stacked on the second glass substrate and oriented toward the first window surface.

14. The display module of claim 13, wherein the OCA film further comprises a front attaching portion interposed between the polarizing plate and the window.

15. The display module of claim 13, wherein the OCA film further comprises a front attaching portion interposed between the second glass substrate and the polarizing plate.

16. The display module of claim 11, further comprising a black film attached to the rear attaching portion.

* * * * *